United States Patent
Yang et al.

(10) Patent No.: US 8,035,210 B2
(45) Date of Patent: Oct. 11, 2011

(54) INTEGRATED CIRCUIT PACKAGE SYSTEM WITH INTERPOSER

(75) Inventors: Joungin Yang, Koyang (KR); Dongjin Jung, Icheon-si (KR); In Sang Yoon, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 65 days.

(21) Appl. No.: 11/966,219

(22) Filed: Dec. 28, 2007

(65) Prior Publication Data

US 2009/0166835 A1    Jul. 2, 2009

(51) Int. Cl.
*H01L 23/48* (2006.01)
*H01L 21/02* (2006.01)

(52) U.S. Cl. ............ 257/686; 257/778; 257/E23.172; 257/E21.002; 438/108; 438/109

(58) Field of Classification Search .............. 257/686
See application file for complete search history.

(56) References Cited

U.S. PATENT DOCUMENTS

| | | | |
|---|---|---|---|
| 6,153,928 A * | 11/2000 | Cho ............................. 257/686 |
| 6,798,057 B2 | 9/2004 | Bolkin et al. | |
| 7,217,994 B2 | 5/2007 | Zhu et al. | |
| 7,247,933 B2 | 7/2007 | Juskey et al. | |
| 7,288,835 B2 | 10/2007 | Yim et al. | |
| 7,550,832 B2 | 6/2009 | Weng et al. | |
| 2006/0220256 A1* | 10/2006 | Shim et al. .................. 257/777 |
| 2007/0229107 A1* | 10/2007 | Kim et al. .................... 324/765 |
| 2008/0157325 A1* | 7/2008 | Chow et al. ................. 257/686 |

FOREIGN PATENT DOCUMENTS

WO    WO 2007/024483 A2    3/2007

\* cited by examiner

*Primary Examiner* — Jarrett Stark
*Assistant Examiner* — Lawrence Tynes, Jr.
(74) *Attorney, Agent, or Firm* — Mikio Ishimaru

(57) ABSTRACT

A method of manufacture of an integrated circuit package system includes: providing a base substrate; coupling a base integrated circuit on the base substrate; forming a double side molded interposer unit over the base integrated circuit including: providing an interposer substrate having an interposer top and an interposer bottom, mounting a first integrated circuit to the interposer bottom and electrically connected thereto, mounting a second integrated circuit to the interposer top and electrically connected thereto, and molding a first chip cover on the first integrated circuit and a second chip cover on the second integrated circuit; and coupling an external component to the double side molded interposer unit.

20 Claims, 4 Drawing Sheets

INTEGRATED CIRCUIT PACKAGE SYSTEM WITH INTERPOSER

TECHNICAL FIELD

The present invention relates generally to integrated circuit packaging, and more particularly to a system for stacking multiple integrated circuit devices in a limited space.

BACKGROUND ART

Faster, more reliable, and higher-density circuits, produced at lower cost, are the goals for the entire integrated circuit (IC) packaging industry to produce smaller devices for cellphones, video cameras, portable music players, etc. The goals of packaging IC for the future will be met by reducing the number of external interconnections and increasing the density of chips. Various techniques, such as, flip chip, ball grid array (BGA), chip on board (COB), and multi-chip modules (MCM), have been developed to meet the continued demands for improving system performance and hardware capabilities, while the space in which to provide these improved hardware capabilities continues to decrease.

Multiple integrated circuit devices may be fabricated within a single package, thereby forming a MCM. A single MCM may include two or more discrete integrated circuit devices, which may be arranged one on top of one another over a substrate (i.e.—vertically stacked). This mounting technique permits a higher density of chips or integrated circuits on the MCM substrate. The substrate may include one or more layers of electrically conductive material separated by dielectric materials.

Although vertically stacked MCM's may increase the effective density of chips, over that of horizontally placed MCM components, it has the disadvantage in that the MCM's must usually be assembled before the component chips and chip connections can be tested. These extra manufacturing steps can lead to increased cost and decreased product yield if the chips are defective.

Another common problem associated with vertically stacked MCM's is that the bottom chip must be larger than the top chip to accommodate the plurality of bond pads located on the bottom chip. Due to the constraint of limited space available for mounting individual chips on a substrate, the larger configuration of the bottom chip decreases the number of chips per semiconductor wafer, and correspondingly, increases the cost of manufacturing.

Another manufacturing technique is vertically stacked packaging (i.e.—a package on package configuration). However, this manufacturing process has its own problems, such as, local and global planarization inconsistencies. Additionally, the mold cap of a bottom package in a package on package structure must be kept thin; otherwise, the ball diameters of the solder balls formed on the top substrate must be excessively large in order to contact the bottom package. However, thin mold caps can cause their own problems during package on package assembly, such as, restricted selection of epoxy molding compounds.

Thus, despite recent developments in semiconductor packaging techniques, a need still remains for an integrated circuit package system that improves packaging device structures and methods of fabrication for increasing semiconductor chip densities. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a base substrate; coupling a base integrated circuit on the base substrate; forming a double side molded interposer unit over the base integrated circuit including: providing an interposer substrate having an interposer top and an interposer bottom, mounting a first integrated circuit to the interposer bottom and electrically connected thereto, mounting a second integrated circuit to the interposer top and electrically connected thereto, and molding a first chip cover on the first integrated circuit and a second chip cover on the second integrated circuit; and coupling an external component to the double side molded interposer unit.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
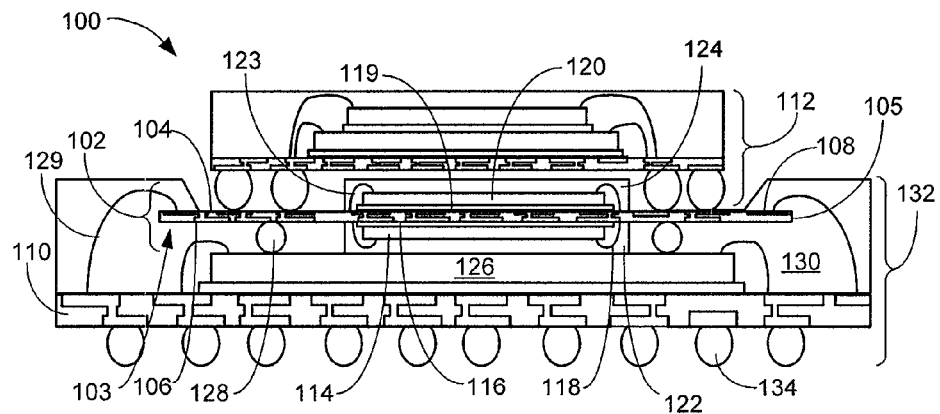
FIG. 1 is a cross-sectional view of an integrated circuit package system with interposer, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the interposer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown is a cross-sectional view of an integrated circuit package system 100 with interposer, in an embodiment of the present invention. The cross-sectional view of the integrated circuit package system 100 depicts a double side molded interposer unit 102 having an interposer substrate 103 with an interposer top 104, vertical terminal sides 105, and an interposer bottom 106. The interposer top 104 may have contact points 108, such as bonding pads or component pads, arranged in a pattern that allows interconnect between a base substrate 110, an external component 112, or a combination thereof. The base substrate 110 may be formed as a ball grid array (BGA), a quad flat no-lead (QFN), a pin grid array (PGA), a flex circuit, or an array of lead fingers that may be singulated from a lead frame. The external component 112 may be an integrated circuit package in the form of the BGA, the PGA, or a leaded device.

The double side molded interposer unit 102 may have a first integrated circuit 114 mounted to the interposer bottom 106 by an adhesive 116. An electrical interconnect 118, such as a bond wire, a formed jumper, a solder ball, or a redistribution layer, may couple the first integrated circuit 114 to the interposer bottom 106 for further distribution. A second integrated circuit 120 may be mounted to the interposer top 104 by a second adhesive 119, which may be the same composition as the adhesive 116. A second interconnect 123 may couple the second integrated circuit 120 to the interposer top 104. The first integrated circuit 114 and the second integrated circuit 120 may be electrically connected to each other, be available for connection at the contact points 108, or a combination thereof. The first integrated circuit 114 is encapsulated by a first chip cover 122. While the second integrated circuit 120 is encapsulated by a second chip cover 124. The first chip cover 122 and the second chip cover 124 may be formed of an epoxy molding compound or some other packaging material.

The double side molded interposer unit 102 may be mounted on a base integrated circuit 126, such as a wire bond integrated circuit, a flip chip integrated circuit, or a stacked combination thereof. The base integrated circuit 126 may include a pre-mold cap (not shown), a shield (not shown), or a combination thereof. An adhesive support 128, such as an epoxy dot, may be used to adhere the double side molded interposer unit 102 to the base integrated circuit 126. The adhesive support 128 may also reduce the movement of the double side molded interposer unit 102 during electrical connection. A bonding interconnect 129 may couple the double side molded interposer unit 102 to the base integrated circuit 126 through the base substrate 110. A base package body 130 may be molded on the double side molded interposer unit 102, the base substrate 110, the base integrated circuit 126, the bonding interconnects 129, and the adhesive support 128. The base package body 130 may be formed by molding the epoxy molding compound, or other packaging material. A base package 132 may include system interconnects 134, such as solder balls, solder bumps, solder columns, or stud bumps. The base package body 130 is formed molded around the double side molded interposer unit 102 to encapsulate the vertical terminal sides 105 and portions of the interposer top 104 and interposer bottom 106.

It has been discovered that the double side molded interposer unit 102 may be fully tested prior to assembly of the base package 132, thus providing an improved manufacturing yield for the base package 132. By use of the double side molded interposer unit 102 the overall package height may be reduced because the base package 132 does not require any additional attachment platform for coupling the external component 112. The external component 112 is shown as the BGA type of package having multiple stacked chips, but this is by way of an example only and the external component 112 may be different.

The double sided interposer is defined as the interposer substrate 103 having the interposer top 104 and the interposer bottom 106. The first integrated circuit 114 is mounted on the interposer bottom 106 by the adhesive 116 and electrically connected to the interposer bottom by the electrical interconnect 118. The first chip cover 122 is formed on the first integrated circuit 114 and the electrical interconnects 118. The second integrated circuit 120 is mounted on the interposer top 104 by the second adhesive 119 and electrically connected to the interposer top 104 by the second interconnect 123. The contact points 108 may be arranged in a pattern on the interposer top 104 for connecting the external component 112, the bonding interconnect 129, or a combination thereof. The second chip cover 122 is formed on the second integrated circuit and the electrical interconnects. The second chip cover 124 does not cover the pattern of the contact points 108.

Figure 2:
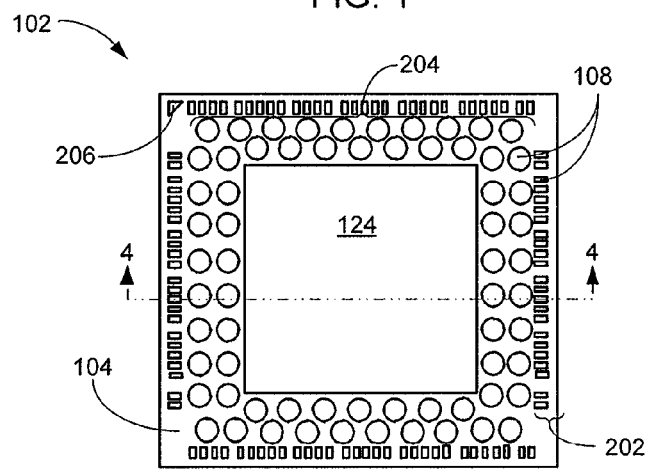
FIG. 2 is a top view of the double side molded interposer unit in an embodiment of the present invention.

Referring now to FIG. 2, therein is shown a top view of the double side molded interposer unit 102 in an embodiment of the present invention. The top view of the double side molded interposer unit 102 depicts the interposer top 104 having the contact points 108 positioned around the second chip cover 124. The contact points 108 may form multiple arrays on the interposer top 104. An outer array 202, such as the array closest to the perimeter of the interposer top 104, may be used for connection to the base substrate 110 of FIG. 1. An inner array 204, such as the array between the outer array 202 and the second chip cover 124, may be used for attaching the external component 112 of FIG. 1. The shape, number of elements, and position of the outer array 202 and the inner array 204 are by way of example only and the shape, number of elements and position may differ. The size shape and position of the second chip cover 124 is an example only and may be different. A position marker 206 may be used to identify the proper orientation of the double side molded interposer unit 102 for testing or assembly in the base package 132 of FIG. 1.

Figure 4:
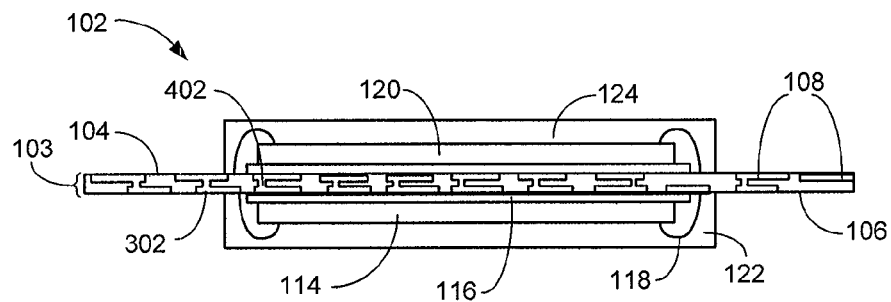
FIG. 4 is a cross-sectional view of the double side molded interposer unit along the section line 4-4 of FIG. 2.

A section line 4-4 shows the position and direction of view displayed in FIG. 4.

Figure 3:
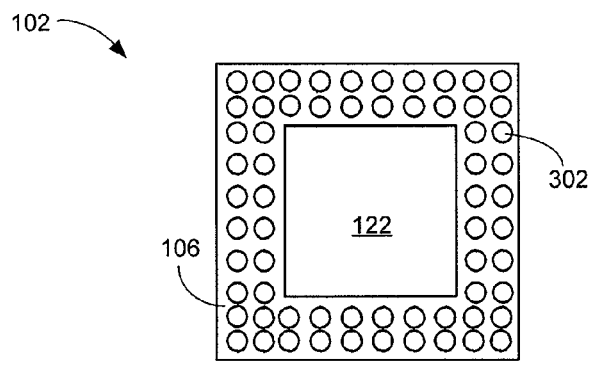
FIG. 3 is a bottom view of the double side molded interposer unit in an embodiment of the present invention.

Referring now to FIG. 3, therein is shown a bottom view of the double side molded interposer unit 102 in an embodiment of the present invention. The bottom view of the double side molded interposer unit 102 depicts the interposer bottom 106 having the first chip cover 122 positioned thereon. The first chip cover 122 is shown positioned substantially in the center of the interposer bottom 106, but this is an example only and the position shape and size of the first chip cover 122 may be different. The interposer bottom may have an array of a contact pad 302 positioned between the first chip cover 122 and the perimeter of the interposer bottom 106. The contact pad 302 may be used for testing the double side molded interposer unit 102.

Referring now to FIG. 4, therein is shown a cross-sectional view of the double side molded interposer unit 102 along the section line 4-4 of FIG. 2. The cross-sectional view of the double side molded interposer unit 102 depicts the interposer substrate 103 with the interposer top 104 having the contact points 108, such as bonding pads or component pads, arranged in a pattern that allows interconnect between the base substrate 110 of FIG. 1, the external component 112 of FIG. 1, or a combination thereof. The first integrated circuit 114 may be mounted to the interposer bottom 106 by the adhesive 116. The electrical interconnect 118, such as a bond wire, a formed jumper, or a redistribution layer, may couple the first integrated circuit 114 to the interposer bottom 106 for further distribution. The second integrated circuit 120 may be mounted to the interposer top 104 by the second adhesive 119. The electrical interconnect 118 may couple the second integrated circuit 120 to the interposer top 104.

The first integrated circuit 114 and the second integrated circuit 120 may be electrically connected to each other, connect to the contact points 108, connect to the contact pad 302, or a combination thereof. The first integrated circuit 114 is encapsulated by the first chip cover 122, while the second integrated circuit 120 is encapsulated by the second chip cover 124. The first chip cover 122 and the second chip cover 124 may be formed of an epoxy molding compound or some other packaging material.

While the first integrated circuit 114 and the second integrated circuit 120 are shown as wire bond type of die, this is an example only and either or both may be a flip chip type of die. An electrical connection may be formed between the first integrated circuit 114 and the second integrated circuit 120 by a via 402 electrically connecting the contact point 108 to the contact pad 302.

It has been discovered that the structure of the double side molded interposer unit 102, having the interposer substrate 103 with a first chip cover 122 that leaves the contact pad 302 exposed and the second chip cover 124 that leaves the contact points 108 exposed, may provide a reduced component height while allowing a fan-in of signals. The fan-in of signals allows more signals within the base package 132 than actually enter the base package 132 thus simplifying the design of the next level system (not shown).

Figure 5:
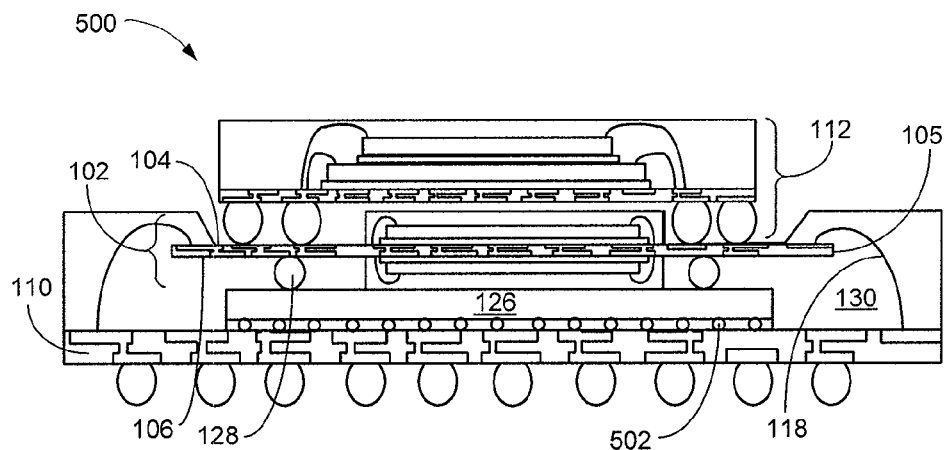
FIG. 5 is a cross-sectional view of an integrated circuit package system, in a first alternative embodiment of the present invention.

Referring now to FIG. 5, therein is shown a cross-sectional view of an integrated circuit package system 500, in a first alternative embodiment of the present invention. The cross-sectional view of the integrated circuit package system 500 depicts the double side molded interposer unit 102 mounted on the base integrated circuit 126, such as a flip chip type of integrated circuit. The adhesive support 128 may stabilize the double side molded interposer unit 102 on the base integrated circuit 126. A chip interconnect 502, such as a solder ball, may couple the base integrated circuit 126 to the base substrate 110.

The double side molded interposer unit 102 may be coupled to the base substrate 110 by the electrical interconnects 118 for electrically connecting to the base integrated circuit 126. The external component 112 may be connected on the double side molded interposer unit 102 also providing an electrical connection between the external component 112, the double side molded interposer unit 102, the base integrated circuit 126, or a combination thereof. The base package body 130 is formed molded around the double side molded interposer unit 102 to encapsulate the vertical terminal sides 105 and portions of the interposer top 104 and interposer bottom 106.

Figure 6:
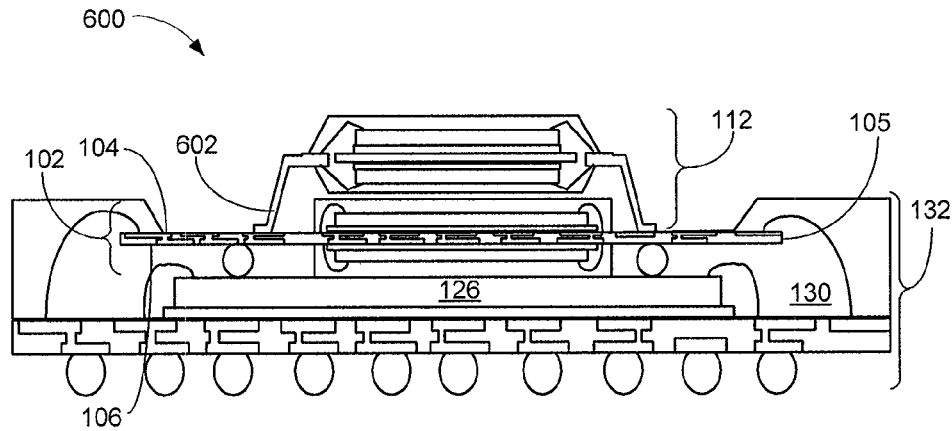
FIG. 6 is a cross-sectional view of an integrated circuit package system, in a second alternative embodiment of the present invention.

Referring now to FIG. 6, therein is shown a cross-sectional view of an integrated circuit package system 600, in a second alternative embodiment of the present invention. The cross-sectional view of the integrated circuit package system 600 depicts the base package 132 having the external component 112 mounted thereon. The external component 112 may be in the form of a leaded package. Lead fingers 602 may form an electrical connection between the external component 112, the double side molded interposer unit 102, the base integrated circuit 126, or a combination thereof.

It has been discovered that by attaching the external component 112 directly to the double side molded interposer unit 102, the overall height of the integrated circuit package system 600 may be reduced. The integrated circuit package system 600 represents a height efficient stacked package-on-package design. The base package body 130 is formed molded around the double side molded interposer unit 102 to encapsulate the vertical terminal sides 105 and portions of the interposer top 104 and interposer bottom 106.

Figure 7:
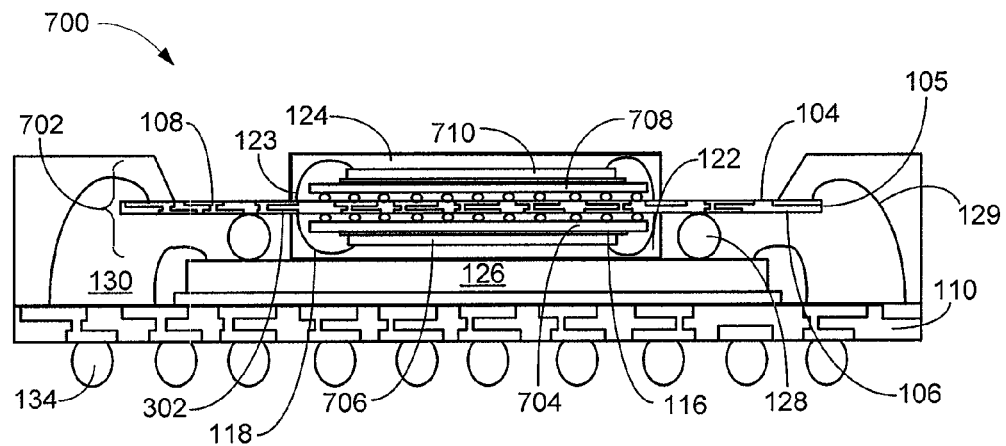
FIG. 7 is a cross-sectional view of an integrated circuit package system, in a third alternative embodiment of the present invention.

Referring now to FIG. 7, therein is shown a cross-sectional view of an integrated circuit package system 700, in a third alternative embodiment of the present invention. The cross-sectional view of the integrated circuit package system 700 depicts a double side molded interposer unit 702 mounted over the base integrated circuit 126.

The double side molded interposer unit 702 may have a first integrated circuit 704, such as a flip chip integrated circuit, mounted on the interposer bottom 106. An electrical connection is formed between the first integrated circuit 704 and the contact pads 302 for further distribution of signals. A second integrated circuit 706, such as a wire bond integrated circuit, may be mounted on the adhesive 116 placed on the first integrated circuit 704. The first integrated circuit 704 and the second integrated circuit 706 are mounted so that their passive sides are adjacent to each other. The active side of the second integrated circuit 706 may be coupled to the contact pads 302 by the electrical interconnect 118. The first chip cover 122 may be formed on the first integrated circuit 704, the second integrated circuit 706, the electrical interconnects 118, and the interposer bottom 106.

The double side molded interposer unit 702 may also have a third integrated circuit 708, such as a flip chip integrated circuit, mounted on the interposer top 104. An electrical connection is formed between the third integrated circuit 708 and the contact points 108 for further distribution of signals. A fourth integrated circuit 710, such as a wire bond integrated circuit, may be mounted on the second adhesive 119 placed on the third integrated circuit 708. The third integrated circuit 708 and the fourth integrated circuit 710 are mounted so that their passive sides are adjacent to each other. The active side of the fourth integrated circuit 710 may be coupled to the contact points 108 by the second interconnect 123. The second chip cover 124 may be formed on the third integrated circuit 708, the fourth integrated circuit 710, the second interconnects 123, and the interposer top 104.

The contact points 108 located along the perimeter of the double side molded interposer unit 702 may be electrically connected to the base substrate 110 by the bonding interconnects 129. Further, the contact points 108 may be used to couple the external component 112 of FIG. 1. The double side molded interposer unit 702 may be mounted on the base integrated circuit 126 by the adhesive support 128. The base package body 130 may be molded on the base substrate 110, the base integrated circuit 126, the bonding interconnects 129, the first chip cover 122, and the adhesive support 128. The base package body 130 is formed molded around the double side molded interposer unit 702 to encapsulate the vertical terminal sides 105 and portions of the interposer top 104 and interposer bottom 106.

The electrical connection to the base substrate may make the signals available for connection to the next level system through the system interconnects 134. This configuration may allow electrical communication between the base integrated circuit 126, the first integrated circuit 704, the second integrated circuit 706, the third integrated circuit 708, the fourth integrated circuit 710, the external component 112, the next level system (not shown), or a combination thereof.

It has been discovered that the integrated circuit package system 700 with interposer of the present invention may provide a reduction in the number of signals required in the system level board by providing those connections within the integrated circuit package system 700. The internal connections are physically shorter and provide better signal quality than those that travel longer distances through the system board (not shown).

Figure 8:
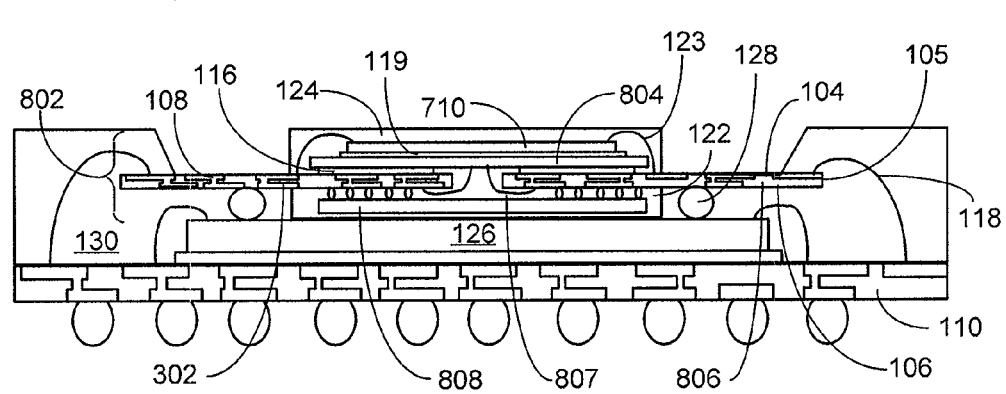
FIG. 8 is a cross-sectional view of an integrated circuit package system, in a fourth alternative embodiment of the present invention.

Referring now to FIG. 8, therein is shown a cross-sectional view of an integrated circuit package system 800, in a fourth alternative embodiment of the present invention. The cross-sectional view of the integrated circuit package system 800 depicts a double side molded interposer unit 802 having a first wire bond chip 804 mounted on the interposer top 104 by the adhesive 116. An opening in an interposer substrate 806 may allow electrical interconnects 807 to couple the first wire bond chip 804 to the contact pads 302 on the interposer bottom 106.

The fourth integrated circuit 710 may be mounted over the first wire bond chip 804 by the second adhesive 119. The first wire bond chip 804 and the fourth integrated circuit 710 are mounted so that their passive sides are adjacent to each other. The second interconnect 123 may couple the active side of the fourth integrated circuit 710 to the contact points 108 on the interposer top 104. The second chip cover 124 may be formed on the first wire bond chip 804, the fourth integrated circuit 710, the second interconnects 123, and the interposer top 104. The contact points on the interposer top 104 remain available for connecting the external component 112, of FIG. 1

A flip chip die 808 may be mounted on the interposer bottom 106. The first chip cover 122 may be formed on the flip chip die 808, the interposer bottom 106, and the electrical interconnects 807 that couple the first wire bond chip 804 to the contact pads 302.

The double side molded interposer unit 802 may be mounted over the base integrated circuit 126 with the adhesive support 128. The electrical interconnects 118 may couple the double side molded interposer unit 802 to the base substrate 110. The base package body 130 may be molded on the base substrate 110, the base integrated circuit 126, the electrical interconnects 118, the first chip cover 122, and the adhesive support 128. The base package body 130 is formed molded around the double side molded interposer unit 802 to encapsulate the vertical terminal sides 105 and portions of the interposer top 104 and interposer bottom 106.

Figure 9:
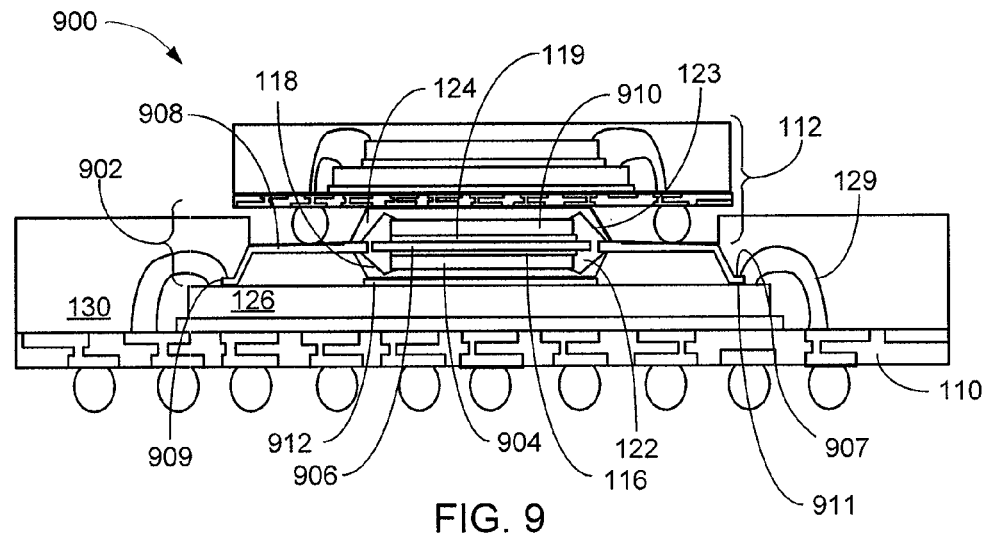
FIG. 9 is a cross-sectional view of an integrated circuit package system, in a fifth alternative embodiment of the present invention.

Referring now to FIG. 9, therein is shown a cross-sectional view of an integrated circuit package system 900, in a fifth alternative embodiment of the present invention. The cross-sectional view of the integrated circuit package system 900 depicts a double side molded interposer unit 902 having a first wire bond chip 904 mounted to a die attach pad 906 by the adhesive 116.

The electrical interconnects 118 may couple the first wire bond chip 904 to a lead finger 908. The first chip cover 122 may be formed on the first wire bond chip 904, the die attach pad 906, the electrical interconnect 118, and the lead finger 908. The lead finger 908 is formed having a top 907, vertical terminal sides 909, and a bottom 911.

A second wire bond chip 910 may be mounted on the die attach pad 906, by the second adhesive 119 attached to the side opposite of the die attach pad 906 as the first wire bond chip 904. The second interconnects 123 may couple the second wire bond chip 910 to the lead finger 908. The second chip cover 124 may be formed on the second wire bond chip 910, the die attach pad 906, the second interconnect 123, and the lead finger 908.

The double side molded interposer unit 902 may be mounted on the base integrated circuit 126 by an attach adhesive 912, such as a glue, an epoxy, or a die attach material. The lead finger 908 may be formed to assist in the support of the double side molded interposer unit 902. The bonding interconnect 129 may couple the lead finger 908 to the base substrate 110. The base package body 130 may be molded on the base substrate 110, the base integrated circuit 126, the bonding interconnects 129, the first chip cover 122, and the lead finger 908. The external component 112 may be mounted on the lead finger 908 and supported by the second chip cover 124. The base package body 130 is formed molded around the double side molded interposer unit 902 to encapsulate the vertical terminal sides 909 and portions of the interposer top 907 and the bottom 911 of the lead finger 908.

Figure 10:
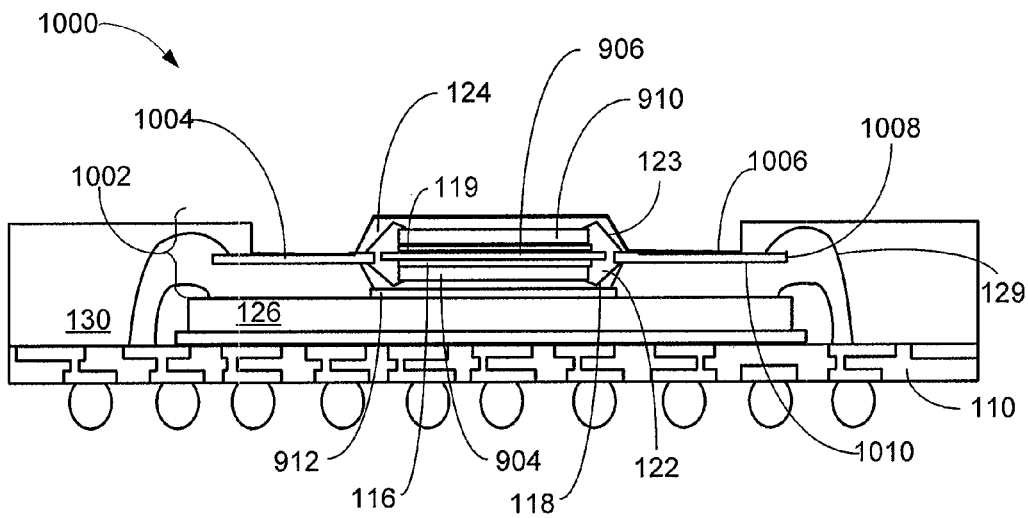
FIG. 10 is a cross-sectional view of an integrated circuit package system, in a sixth alternative embodiment of the present invention.

Referring now to FIG. 10, therein is shown a cross-sectional view of an integrated circuit package system 1000, in a sixth alternative embodiment of the present invention. The cross-sectional view of the integrated circuit package system 1000 depicts a double side molded interposer unit 1002 having the first wire bond chip 904 mounted to the die attach pad 906 by the adhesive 116. The electrical interconnects 118 may couple the first wire bond chip 904 to a lead finger 1004. The first chip cover 122 may be formed on the first wire bond chip 904, the die attach pad 906, the electrical interconnect 118, and the lead finger 1004. The lead finger 1004 is formed having a top 1006, vertical terminal sides 1008, and a bottom 1010.

The second wire bond chip 910 may be mounted on the die attach pad 906, by the second adhesive 119 attached to the side opposite the first wire bond chip 904. The second interconnects 123 may couple the second wire bond chip 910 to the lead finger 1004. The second chip cover 124 may be formed on the second wire bond chip 910, the die attach pad 906, the second interconnects 123, and the lead finger 1004.

The double side molded interposer unit 1002 may be mounted on the base integrated circuit 126 by the attach adhesive 912. The bonding interconnect 129 may couple the lead finger 1004 to the base substrate 110. The lead finger 1004 may remain in the same plane as the die attach pad 906. The base package body 130 may be molded on the base substrate 110, the base integrated circuit 126, the bonding interconnects 129, the first chip cover 122, and the lead finger 1004. The external component 112, of FIG. 1, may be mounted on the lead finger 1004 and supported by the second chip cover 124. The base package body 130 is formed molded around the double side molded interposer unit 1002 to encapsulate the vertical terminal sides 1008 and portions of the top 1006 and the bottom 1008 of the lead finger 1004.

Figure 11:
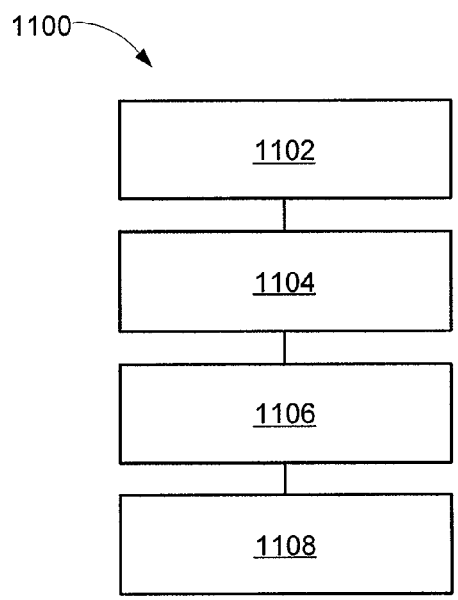
FIG. 11 is a flow chart of an integrated circuit package system for manufacturing the integrated circuit package system with interposer in an embodiment of the present invention.

Referring now to FIG. 11, therein is shown a flow chart of an integrated circuit package system 1100 for manufacturing the integrated circuit package system 100 with interposer in an embodiment of the present invention. The system 1100 includes providing a base substrate in a block 1102; coupling a base integrated circuit on the base substrate in a block 1104; forming a double side molded interposer unit over the base integrated circuit including: providing an interposer substrate having an interposer top and an interposer bottom, mounting a first integrated circuit to the interposer bottom and electrically connected thereto, mounting a second integrated circuit to the interposer top and electrically connected thereto, and molding a first chip cover on the first integrated circuit and a second chip cover on the second integrated circuit in a block 1106; and coupling an external component to the double side molded interposer unit in a block 1108.

It has been discovered that the present invention thus has numerous aspects.

A principle aspect that has been unexpectedly discovered is that the present invention may result in a lower vertical height while increasing the circuit density.

Another aspect is the present invention may allow a fan-in of signals by allowing any of the integrated circuits within the package to communicate with each other without going through the system board.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for forming package-on-package devices that allow a fan-in of signals. The resulting processes and configurations are straightforward, cost-effective, uncomplicated, highly versatile and effective, can be surprisingly and unobviously implemented by adapting known technologies, and are thus readily suited for efficiently and economically manufacturing package-on-package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system including: providing a base substrate; coupling a base integrated circuit on the base substrate; forming a double side molded interposer unit over the base integrated circuit including: providing an interposer substrate having vertical terminal sides, an interposer top, and an interposer bottom, mounting a first integrated circuit to the interposer bottom and electrically connected thereto, mounting a second integrated circuit to the interposer top and electrically connected thereto, and molding a first chip cover on the first integrated circuit, the first chip cover in direct physical contact with the base integrated circuit, and a second chip cover on the second integrated circuit; molding a base package body around the double side molded interposer unit to encapsulate the vertical terminal sides and portions of the interposer top and interposer bottom; and coupling an external component to the double side molded interposer unit.

2. The method as claimed in claim 1 wherein:
mounting the first integrated circuit to the interposer bottom including mounting a flip chip die, a wire bond chip, or a stack thereof; and
mounting the second integrated circuit to the interposer top including mounting a flip chip die, a wire bond chip, or a stack thereof.

3. The method as claimed in claim 1 further comprising forming a contact point on the double side molded interposer unit for coupling the external component, an electrical interconnect between the double side molded interposer unit and the base substrate, or a combination thereof.

4. The method as claimed in claim 1 further comprising forming a base package including:
attaching an adhesive support between the double side molded interposer unit and the base integrated circuit; and
wherein:
molding the base package body includes forming the base package body on the base integrated circuit, the base substrate, and the double side molded interposer unit while leaving a contact point exposed between a second chip cover and the base package body.

5. The method as claimed in claim 1 wherein forming the double side molded interposer unit includes forming an interposer substrate or forming a lead finger.

6. A method of manufacture of an integrated circuit package system including: providing a base substrate including providing a ball grid array substrate, a quad flat no-lead substrate, or an array of lead fingers; coupling a base integrated circuit on the base substrate includes coupling a flip chip integrated circuit or a wire bond integrated circuit; forming a double side molded interposer unit, over the base integrated circuit including: providing an interposer substrate having vertical terminal sides, an interposer top, and an interposer bottom, mounting a first integrated circuit to the interposer bottom and electrically connected thereto, mounting a second integrated circuit to the interposer top and electrically connected thereto, and molding a first chip cover on the first integrated circuit, the first chip cover in direct physical contact with the base integrated circuit, and a second chip cover on the second integrated circuit; molding a base package body around the double side molded interposer unit to encapsulate the vertical terminal sides and portions of the interposer tot~ and interposer bottom; and coupling an external component to the double side molded interposer unit including coupling a ball grid array, a pin grid array, or a leaded package to the interposer top.

7. The method as claimed in claim 6 wherein:
mounting the first integrated circuit to the interposer bottom including mounting a flip chip die, a wire bond chip, or a stack thereof by coupling the flip chip die to the interposer bottom and coupling the wire bond chip by an adhesive; and
mounting the second integrated circuit to the interposer top including mounting a flip chip die, a wire bond chip, or a stack thereof by coupling the flip chip die to the interposer top and coupling the wire bond chip by the adhesive.

8. The method as claimed in claim 6 further comprising forming a contact point on the double side molded interposer unit for coupling the external component, an electrical interconnect between the double side molded interposer unit and the base substrate, or a combination thereof including forming an outer array and an inner array of the contact points.

9. The method as claimed in claim 6 further comprising forming a base package including:
attaching an adhesive support between the double side molded interposer unit and the base integrated circuit including attaching an epoxy dot; and
wherein:
molding the base package body includes forming the base package body on the base integrated circuit, the base substrate, and the double side molded interposer unit while leaving a contact point exposed between a second chip cover and the base package body including molding an epoxy molding compound or other packaging material on the base integrated circuit having a pre-mold cap, a shield, or a combination thereof.

10. The method as claimed in claim 6 wherein forming the double side molded interposer unit includes forming an interposer substrate or forming a lead finger including providing a contact point on the interposer top for coupling the external component.

11. An integrated circuit package system including:
a base substrate; a base integrated circuit on the base substrate;
a double side molded interposer unit over the base integrated circuit includes:
an interposer substrate with vertical terminal sides, an interposer top, and
an interposer bottom, a first integrated circuit mounted to the interposer bottom and electrically connected thereto, a second integrated circuit mounted to the interposer top and electrically connected thereto, a first chip cover molded on the first integrated circuit, the first chip cover in direct physical contact with the base integrated circuit, and a second chip cover molded over the second integrated circuit;
a base package body around the double side molded interposer unit to encapsulate the vertical terminal sides and portions of the interposer top and interposer bottom: and
an external component coupled to the double side molded interposer unit.

12. The system as claimed in claim 11 wherein:
the first integrated circuit mounted to the interposer bottom includes a flip chip die, a wire bond die, or a stack thereof mounted to the interposer bottom; and
the second integrated circuit mounted to the interposer top includes a flip chip die, a wire bond die, or a stack thereof mounted to the interposer top.

13. The system as claimed in claim 11 further comprising a contact point on the double side molded interposer unit for coupling the external component, an electrical interconnect between the double side molded interposer unit and the base substrate, or a combination thereof.

14. The system as claimed in claim 11 further comprising a base package including:
an adhesive support between the double side molded interposer unit and the base integrated circuit; and
wherein:
the base package body is formed on the base integrated circuit, the base substrate, and the double side molded interposer unit with a contact point exposed between a second chip cover and the base package body.

15. The system as claimed in claim 11 wherein the double side molded interposer unit includes an interposer substrate or a lead finger.

16. The system as claimed in claim 11 further comprising:
a ball grid array, substrate, a quad flat no-lead substrate, or an array of lead fingers as the base substrate;
a flip chip die or a wire bond chip on the base substrate; and
a ball grid array, a pin grid array, or a leaded package coupled to the interposer top.

17. The system as claimed in claim 16 wherein:
the first integrated circuit mounted to the interposer bottom includes a flip chip die, a wire bond chip, or a stack thereof mounted to the interposer bottom by the flip chip die coupled to the interposer bottom and the wire bond chip coupled by an adhesive; and
the second integrated circuit mounted to the interposer top includes the flip chip die, the wire bond chip, or the stack thereof mounted to the interposer top by the flip chip die coupled to the interposer top and the wire bond chip coupled by the adhesive.

18. The system as claimed in claim 16 further comprising a contact point on the double side molded interposer unit for coupling the external component, an electrical interconnect between the double side molded interposer unit and the base substrate, or a combination thereof includes an outer array and an inner array of the contact points.

19. The system as claimed in claim 16 further comprising forming a base package including:
an adhesive support between the double side molded interposer unit and the base integrated circuit includes an epoxy dot attached; and
wherein:
the base package body is formed on the base integrated circuit, the base substrate, and the double side molded interposer unit with a contact point exposed between the second chip cover and the base package body includes the base package body formed by an epoxy molding compound or other packaging material molded on the base integrated circuit with a pre-mold cap, a shield, or a combination thereof.

20. The system as claimed in claim 16 wherein the double side molded interposer unit includes an interposer substrate or a lead finger include a contact point on the interposer top for coupling the external component.

* * * * *

UNITED STATES PATENT AND TRADEMARK OFFICE
CERTIFICATE OF CORRECTION

| | | |
|---|---|---|
| PATENT NO. | : 8,035,210 B2 | Page 1 of 3 |
| APPLICATION NO. | : 11/966219 | |
| DATED | : October 11, 2011 | |
| INVENTOR(S) | : Yang et al. | |

It is certified that error appears in the above-identified patent and that said Letters Patent is hereby corrected as shown below:

In the Claims:

Column 10, lines 4-22, claim 1, delete
"A method of manufacture of an integrated circuit package system including: providing a base substrate; coupling a base integrated circuit on the base substrate; forming a double side molded interposer unit over the base integrated circuit including: providing an interposer substrate having vertical terminal sides, an interposer top, and an interposer bottom, mounting a first integrated circuit to the interposer bottom and electrically connected thereto, mounting a second integrated circuit to the interposer top and electrically connected thereto, and molding a first chip cover on the first integrated circuit, the first chip cover in direct physical contact with the base integrated circuit, and a second chip cover on the second integrated circuit; molding a base package body around the double side molded interposer unit to encapsulate the vertical terminal sides and portions of the interposer top and interposer bottom; and coupling an external component to the double side molded interposer unit."

and insert therefor claim as reformatted so that each element begins on a new line and indentations as shown:

--A method of manufacture of an integrated circuit package system including:
  providing a base substrate;
  coupling a base integrated circuit on the base substrate;
  forming a double side molded interposer unit over the base integrated circuit including:
    providing an interposer substrate having vertical terminal sides, an interposer top, and an
      interposer bottom,
    mounting a first integrated circuit to the interposer bottom and electrically connected thereto,
    mounting a second integrated circuit to the interposer top and electrically connected thereto,
    and Signed and Sealed this
Twenty-fourth Day of May, 2016

Michelle K. Lee
*Director of the United States Patent and Trademark Office* molding a first chip cover on the first integrated circuit, the first chip cover in direct physical contact with the base integrated circuit, and a second chip cover on the second integrated circuit;

molding a base package body around the double side molded interposer unit to encapsulate the vertical terminal sides and portions of the interposer top and interposer bottom; and coupling an external component to the double side molded interposer unit.--

Column 10, line 49 to Column 11, line 5, claim 6, delete
"A method of manufacture of an integrated circuit
package system including: providing a base substrate including providing a ball grid array substrate, a quad flat no-lead substrate, or an array of lead fingers; coupling a base integrated circuit on the base substrate includes coupling a flip chip integrated circuit or a wire bond integrated circuit; forming a double side molded interposer unit, over the base integrated circuit including: providing an interposer substrate having vertical terminal sides, an interposer top, and an interposer bottom, mounting a first integrated circuit to the interposer bottom and electrically connected thereto, mounting a second integrated circuit to the interposer top and electrically connected thereto, and molding a first chip cover on the first integrated circuit, the first chip cover in direct physical contact with the base integrated circuit, and a second chip cover on the second integrated circuit; molding a base package body around the double side molded interposer unit to encapsulate the vertical terminal sides and portions of the interposer tot~ and interposer bottom; and coupling an external component to the double side molded interposer unit including coupling a ball grid array, a pin grid array, or a leaded package to the interposer top."

and insert therefor claim as reformatted so that each element begins on a new line and indentations as shown:

--A method of manufacture of an integrated circuit package system including:
 providing a base substrate including providing a ball grid array substrate, a quad flat no-lead substrate, or an array of lead fingers;
 coupling a base integrated circuit on the base substrate includes coupling a flip chip integrated circuit or a wire bond integrated circuit;
 forming a double side molded interposer unit, over the base integrated circuit including:
   providing an interposer substrate having vertical terminal sides, an interposer top, and an interposer bottom,
   mounting a first integrated circuit to the interposer bottom and electrically connected thereto,
   mounting a second integrated circuit to the interposer top and electrically connected thereto, and
molding a first chip cover on the first integrated circuit, the first chip cover in direct physical contact with the base integrated circuit, and a second chip cover on the second integrated circuit;
   molding a base package body around the double side molded interposer unit to encapsulate the vertical terminal sides and portions of the interposer top, and interposer bottom; and

CERTIFICATE OF CORRECTION (continued)
U.S. Pat. No. 8,035,210 B2 coupling an external component to the double side molded interposer unit including coupling a ball grid array, a pin grid array, or a leaded package to the interposer top.--

Column 11, lines 42-61, claim 11, delete
"An integrated circuit package system including:
a base substrate; a base integrated circuit on the base substrate;
a double side molded interposer unit over the base integrated circuit includes:
an interposer substrate with vertical terminal sides, an interposer top, and
an interposer bottom, a first integrated circuit mounted to the interposer bottom and electrically connected thereto, a second integrated circuit mounted to the interposer top and electrically connected thereto, a first chip cover molded on the first integrated circuit, the first chip cover in direct physical contact with the base integrated circuit, and a second chip cover molded over the second integrated circuit;
a base package body around the double side molded interposer unit to encapsulate the vertical terminal sides and portions of the interposer top and interposer bottom: and
an external component coupled to the double side molded interposer unit."

and insert therefor claim as reformatted so that each element begins on a new line and indentations as shown:

--An integrated circuit package system including:
a base substrate;
a base integrated circuit on the base substrate;
a double side molded interposer unit over the base integrated circuit includes:
an interposer substrate with vertical terminal sides, an interposer top, and an interposer bottom,
a first integrated circuit mounted to the interposer bottom and electrically connected thereto,
a second integrated circuit mounted to the interposer top and electrically connected thereto,
a first chip cover molded on the first integrated circuit, the first chip cover in direct physical contact with the base integrated circuit, and
a second chip cover molded over the second integrated circuit;
a base package body around the double side molded interposer unit to encapsulate the vertical terminal sides and portions of the interposer top and interposer bottom; and
an external component coupled to the double side molded interposer unit.--